(12) United States Patent
Newlin

(10) Patent No.: US 11,456,747 B1
(45) Date of Patent: Sep. 27, 2022

(54) MULTIPHASE FREQUENCY TO VOLTAGE CONVERTER

(71) Applicant: NXP USA, Inc., Austin, TX (US)

(72) Inventor: Trevor Mark Newlin, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/230,863

(22) Filed: Apr. 14, 2021

(51) Int. Cl.
| | | |
|---|---|---|
| *H03L 7/02* | (2006.01) |
| *G01R 23/06* | (2006.01) |
| *H03L 7/085* | (2006.01) |
| *G01R 23/09* | (2006.01) |
| *H03L 7/097* | (2006.01) |

(52) U.S. Cl.
CPC .............. *H03L 7/02* (2013.01); *G01R 23/06* (2013.01); *G01R 23/09* (2013.01); *H03L 7/085* (2013.01); *H03L 7/097* (2013.01)

(58) Field of Classification Search
CPC ........... H03L 7/02; H03L 7/097; G01R 23/06; G01R 23/09
See application file for complete search history.

(56) References Cited

U.S. PATENT DOCUMENTS

| | | | |
|---|---|---|---|
| 8,981,856 B1 | 3/2015 | Newlin | |
| 2006/0063502 A1* | 3/2006 | Shibuya | H03L 7/02 455/76 |
| 2020/0136629 A1* | 4/2020 | Kirschner | H03L 7/0997 |

* cited by examiner

*Primary Examiner* — Ryan Johnson

(57) ABSTRACT

A method for multiphase frequency to voltage conversion includes generating for each cycle of an oscillating input, one of a plurality of non-overlapping clocks. A respective voltage in proportion to an input frequency of the oscillating input, is generated in response to each of the non-overlapping clocks, with a respective one of a plurality of frequency to voltage converters. Each of the respective voltages is summated to generate a voltage sum proportional to the input frequency.

15 Claims, 11 Drawing Sheets

Transfer Phase

Charge Phase

Discharge Phase

MULTIPHASE FREQUENCY TO VOLTAGE CONVERTER

FIELD

This disclosure relates generally to frequency to voltage converters, and more specifically to a multiphase frequency to voltage converter having a fast settling response.

BACKGROUND

Electronic systems often require a stable frequency reference. In particular, power sensitive semiconductor systems rely upon rapid activation and deactivation of clocks, derived from the frequency reference, to minimize power consumption. Existing closed loop oscillators can have significant settling times upon reactivation, which degrades system performance. Furthermore, the stability and settling time of existing closed loop oscillators may depend significantly on operating temperature.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
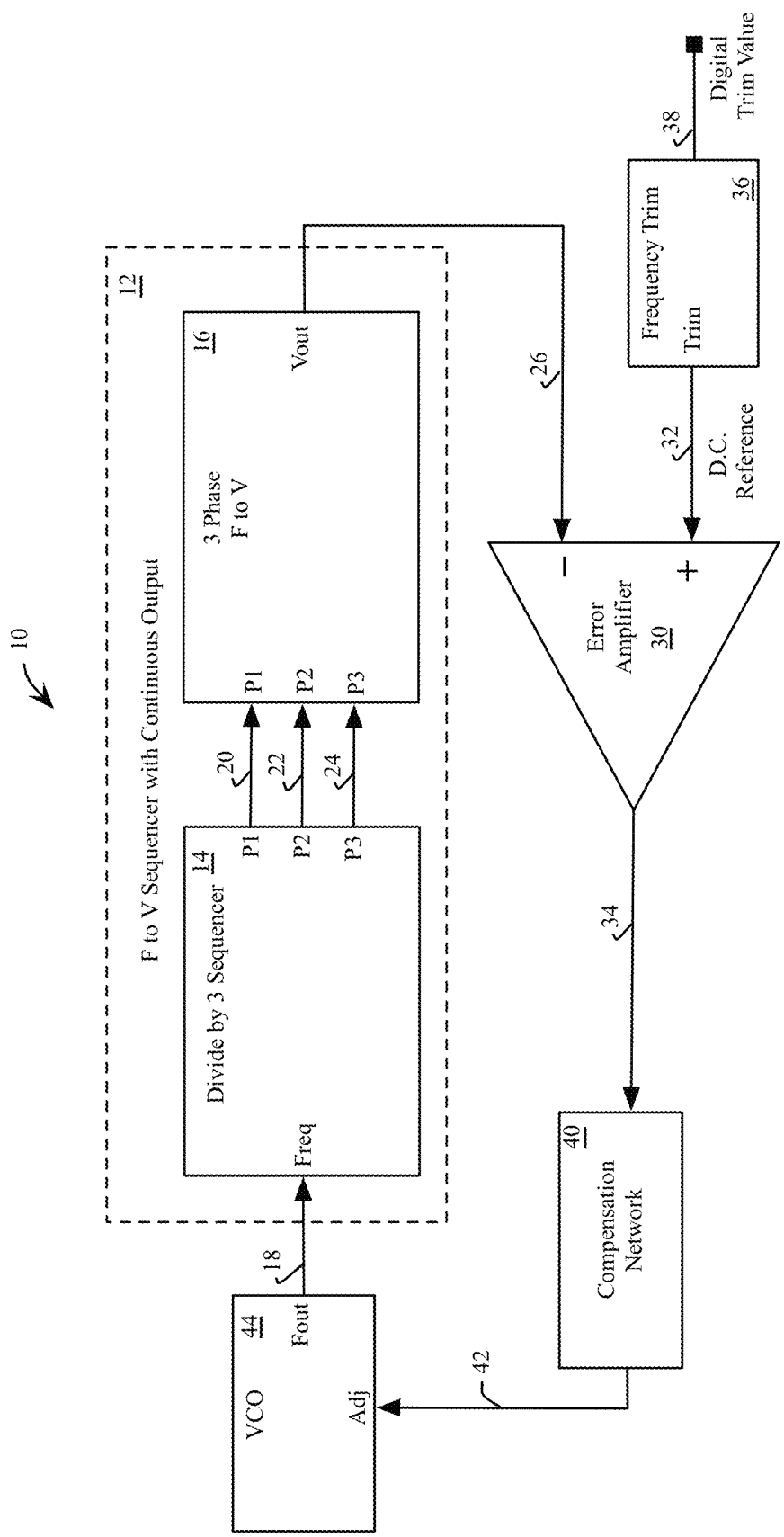
FIG. 1 is a schematic view of a multiphase frequency to voltage converter for a fast settling Voltage Controlled Oscillator (VCO) system, in accordance with an example embodiment of the present disclosure.

Embodiments described here provide a multiphase frequency to voltage converter with rapid settling time and high stability. In some embodiments, the multiphase frequency to voltage converter further enables a VCO system with similar improvements to stability and settling time. FIG. 1 shows an example embodiment 10 of a fast settling VCO system. The embodiment 10 includes a frequency to voltage sequencer with continuous output 12, further comprising a divide by three sequencer 14 and a three-phase frequency to voltage circuit 16. In other embodiments, the frequency to voltage sequencer with continuous output 12 includes at least three phases with a corresponding multi-phase sequencer and multi-phase frequency to voltage circuit. Additional phases improve settling response at the expense of area and complexity.

In the embodiment 10, the divide by three sequencer receives an oscillating input 18 and generates a series of non-overlapping clocks as P1 20, P2 22 and P3 24, in response thereto. Each of the clocks P1 20, P2 22 and P3 24 are sequentially active for one period of the oscillating input 18. Each of the clocks P1 20, P2 22 and P3 24 control each of three frequency to voltage channels in the three-phase frequency to voltage circuit 16. In one embodiment, each of the three frequency to voltage channels are designed to be substantially identical within the limits of normal process variation and/or voltage or temperature gradients. For a constant frequency of the oscillating input 18, each of frequency to voltage channels is designed to have a low output temperature coefficient (e.g., the voltage generated from each respective channel has little variance with respect to temperature variation).

The frequency to voltage sequencer with continuous output 12 generates an output voltage (Vout) 26 proportional to an input frequency of the oscillating input 18. An error amplifier 30 determines an error voltage 34 from a difference between the output voltage 26 and a direct current (D.C.) reference voltage 32. In one embodiment, the error voltage 34 adjusts the VCO in a feedback loop to determine the frequency of the oscillating input 18 relative to the DC reference voltage 32. In another embodiment, the error voltage 34 is compensated with a compensation network 40 to determine a compensated error voltage 42, used to adjust the VCO frequency. The compensation network 40 includes components, (e.g., capacitors), to improve dynamic stability of the embodiment 10. In one embodiment, the DC reference voltage 32 is determined from a frequency trim circuit 36 in response to a digital trim value 38. The frequency trim circuit 36 further reduces the embodiment 10 sensitivity to process, voltage and temperature variations. In one example embodiment, the frequency trim circuit is a 5-bit Digital to Analog Converter (DAC). The example embodiment 10 does not require an external bias current nor bandgap reference as typically used in VCO systems.

Figure 2:
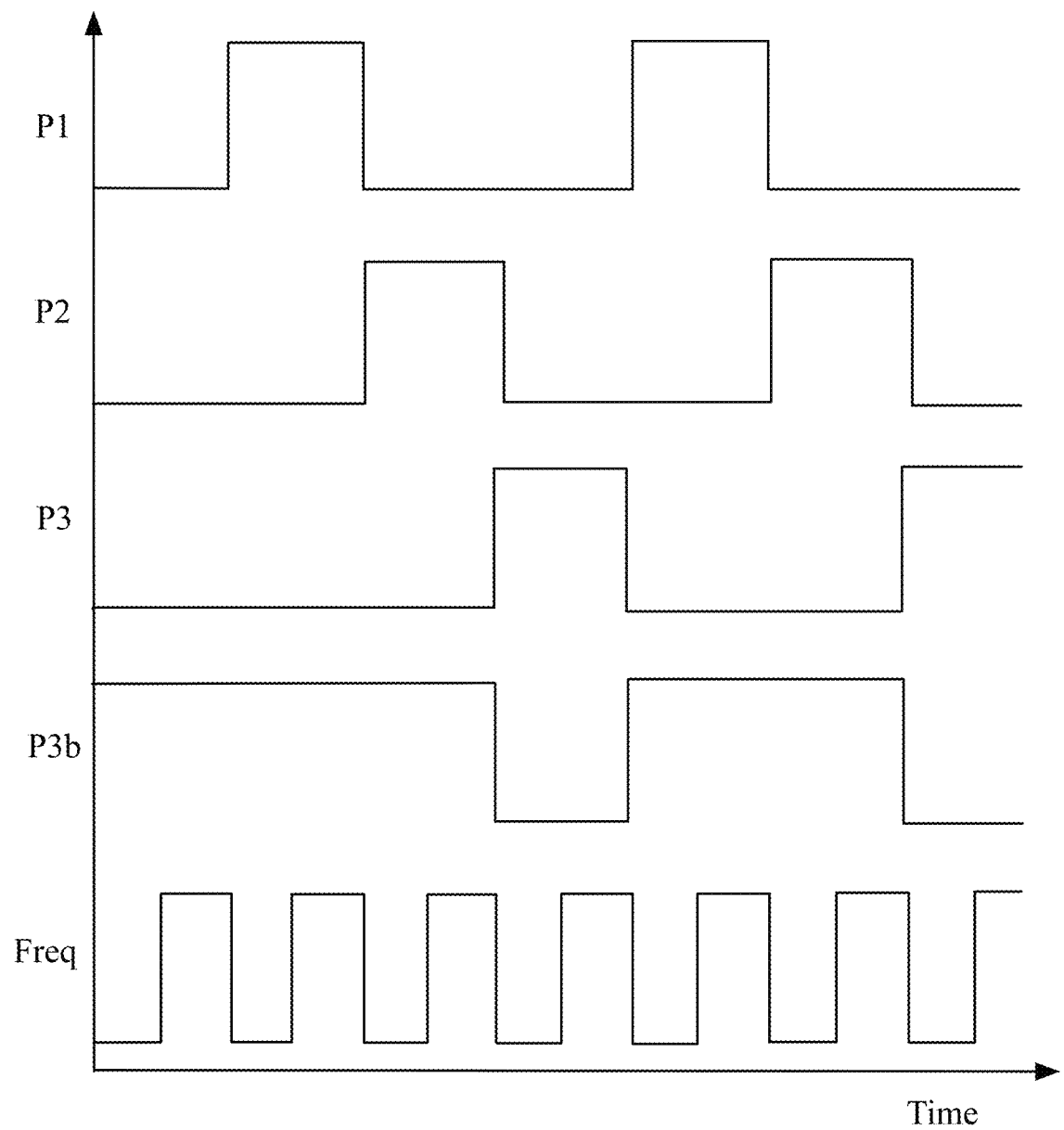
FIG. 2 is a graphical view of a timing diagram for generating multiphase control signals to control the frequency to voltage converter of FIG. 1, in accordance with an example embodiment of the present disclosure.
Figure 3:
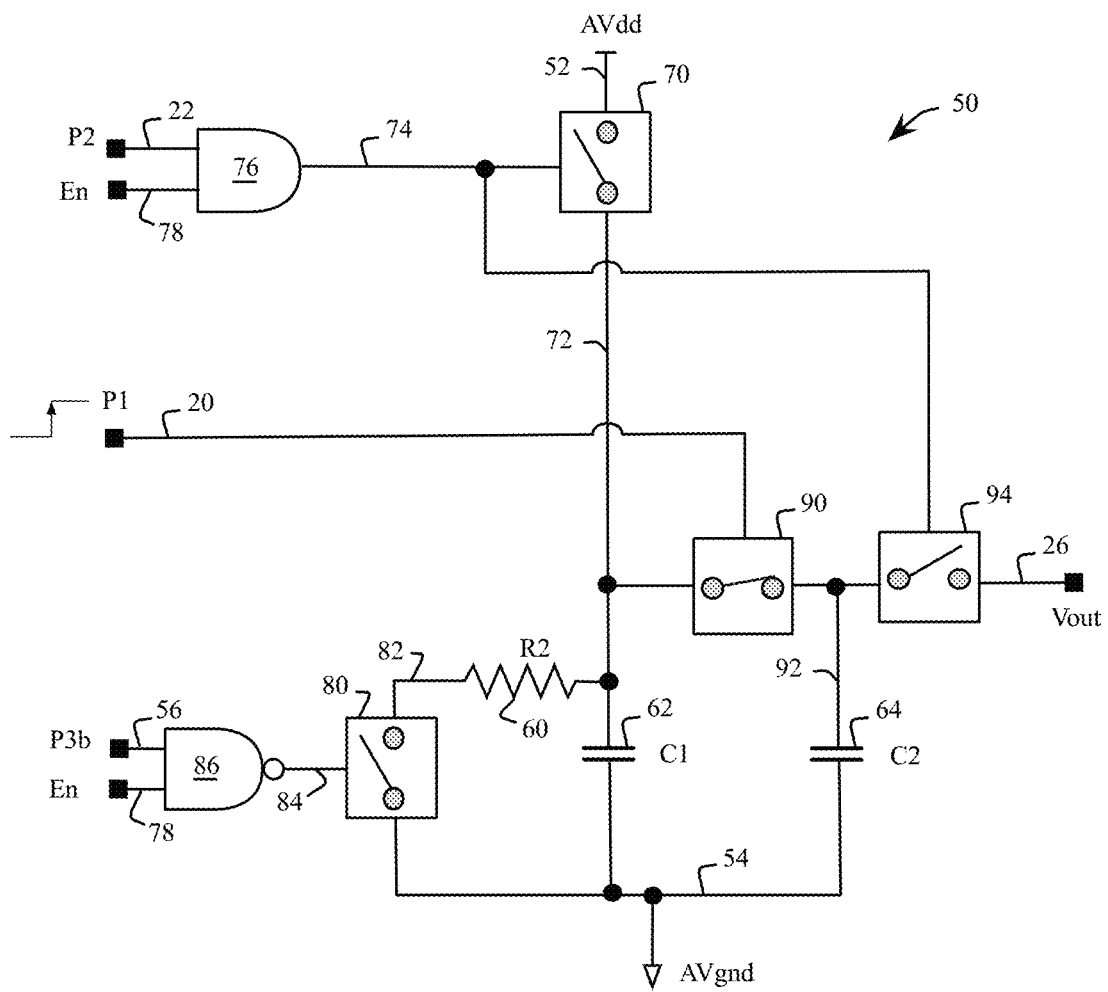
FIG. 3 is a schematic view of an example embodiment of a frequency to voltage channel configured in a Transfer phase.
Figure 4:
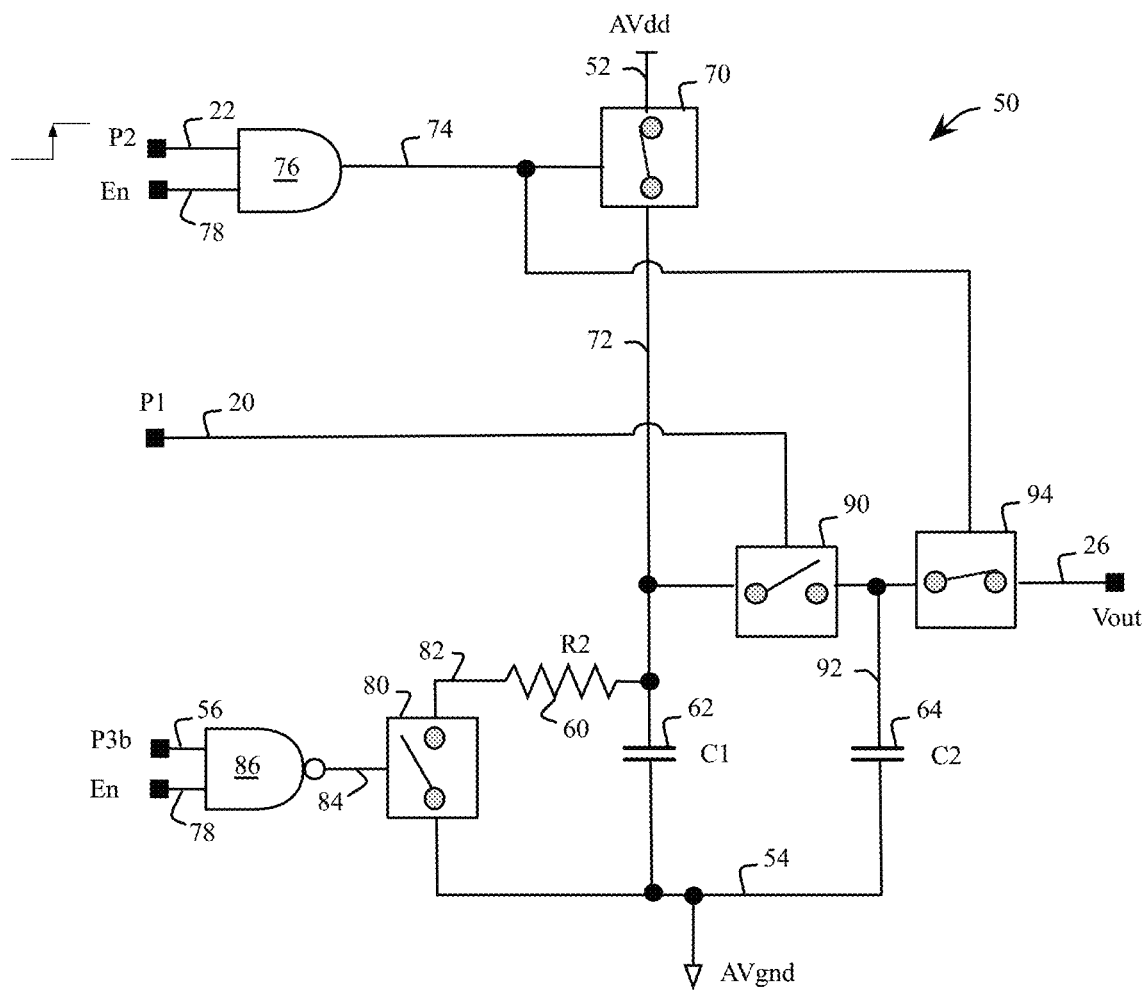
FIG. 4 is a schematic view of an example embodiment of a frequency to voltage channel configured in a Charge phase.
Figure 5:
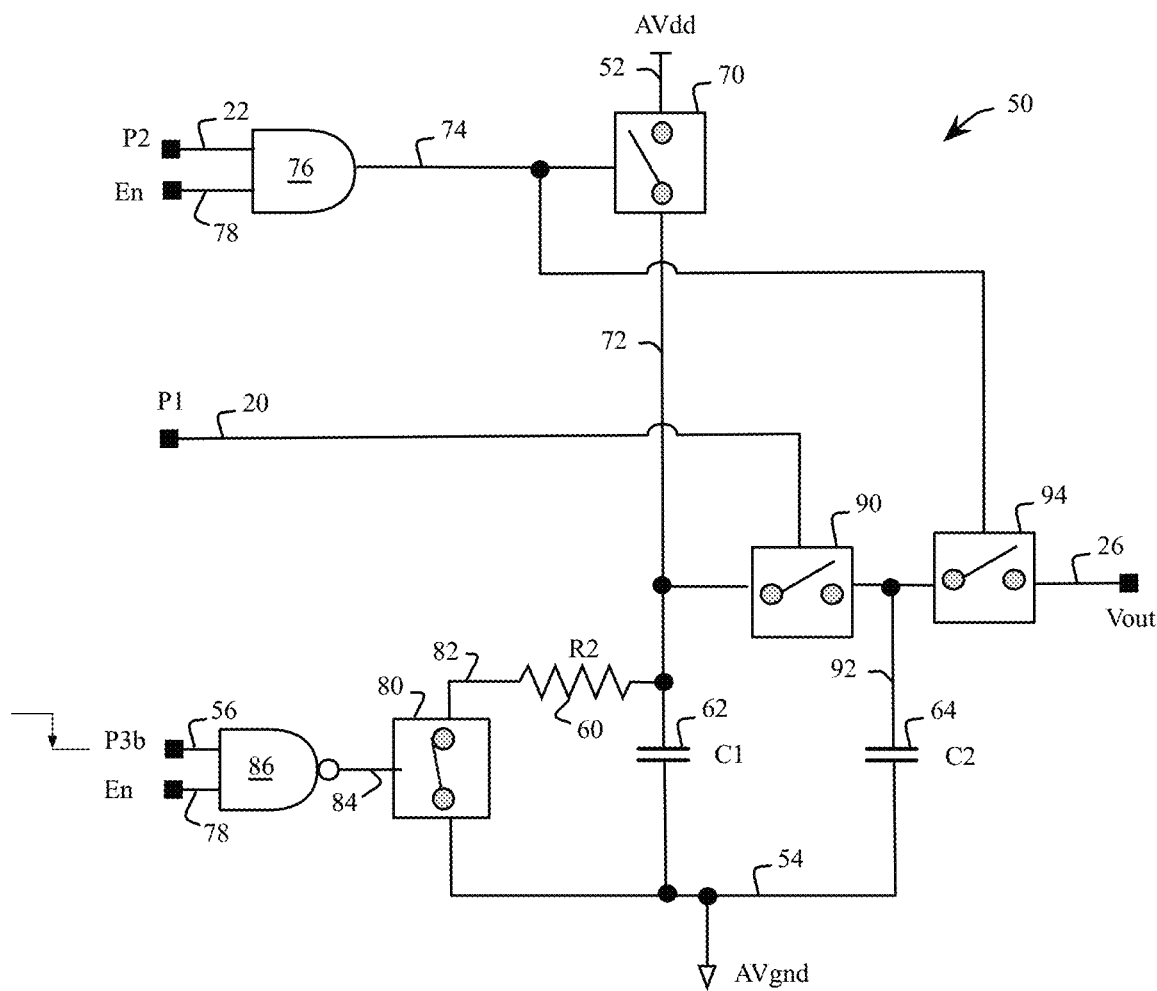
FIG. 5 is a schematic view of an example embodiment of a frequency to voltage channel configured in a Discharge phase.

FIG. 2, with reference to FIG. 1, shows a timing diagram of the three phase timing signals generated by the divide by three sequencer 14. FIG. 3, FIG. 4 and FIG. 5, with reference to FIG. 1, show three different operating phases of each of the frequency to voltage channels comprising the three-phase frequency to voltage circuit 16. Specifically, FIG. 3 shows an embodiment 50 of the frequency to voltage channel configured in a transfer phase. The embodiment 50 is connected between a power (Avdd) 52 and a ground (AVgnd) 54 potential. The embodiment 50 generates the output voltage 26 in response to the phase signals P1 20, P2 22 and an inverted P3 24, shown as P3b 56. The output voltage 26 is generated by charging, and discharging a voltage defined by a time constant established by a timing resistor 60 and a timing capacitor 62. The voltage is subsequently transferred from the timing capacitor 62 to a holding capacitor 64.

A switch 70 is connected between the power 52 and a net 72. The switch 70 is activated (e.g., closed), by a signal on a net 74. The signal on net 74 is generated by an AND gate 76, controlled by P2 22 and an enable signal (En) 78. When P2 22 is active and the embodiment 50 is enabled with En 78 high, the switch 70 charges the timing capacitor 62 through net 72. The timing resistor 60 is connected to a switch 80 through net 82. The switch 80 is controlled by a NAND signal on net 84 in response to P3*b* 56 and En 78 being active. When P3*b* 56 is active and En 78 is enabled, the switch 80 discharges the timing capacitor 62 through the resistor 60. After charging and discharging a voltage on net 72, P1 20 transfers the voltage on net 72 through a switch 90 to the net 92, connected to the holding capacitor 64. During the charging phase when P2 22 activates the switch 70, a switch 94 is also activated to transfer the charge on the holding capacitor 64 to the voltage output 26. FIG. 3, FIG. 4 and FIG. 5 show the transfer phase, charge phase and discharge phase of embodiment 50 respectively.

Figure 6:
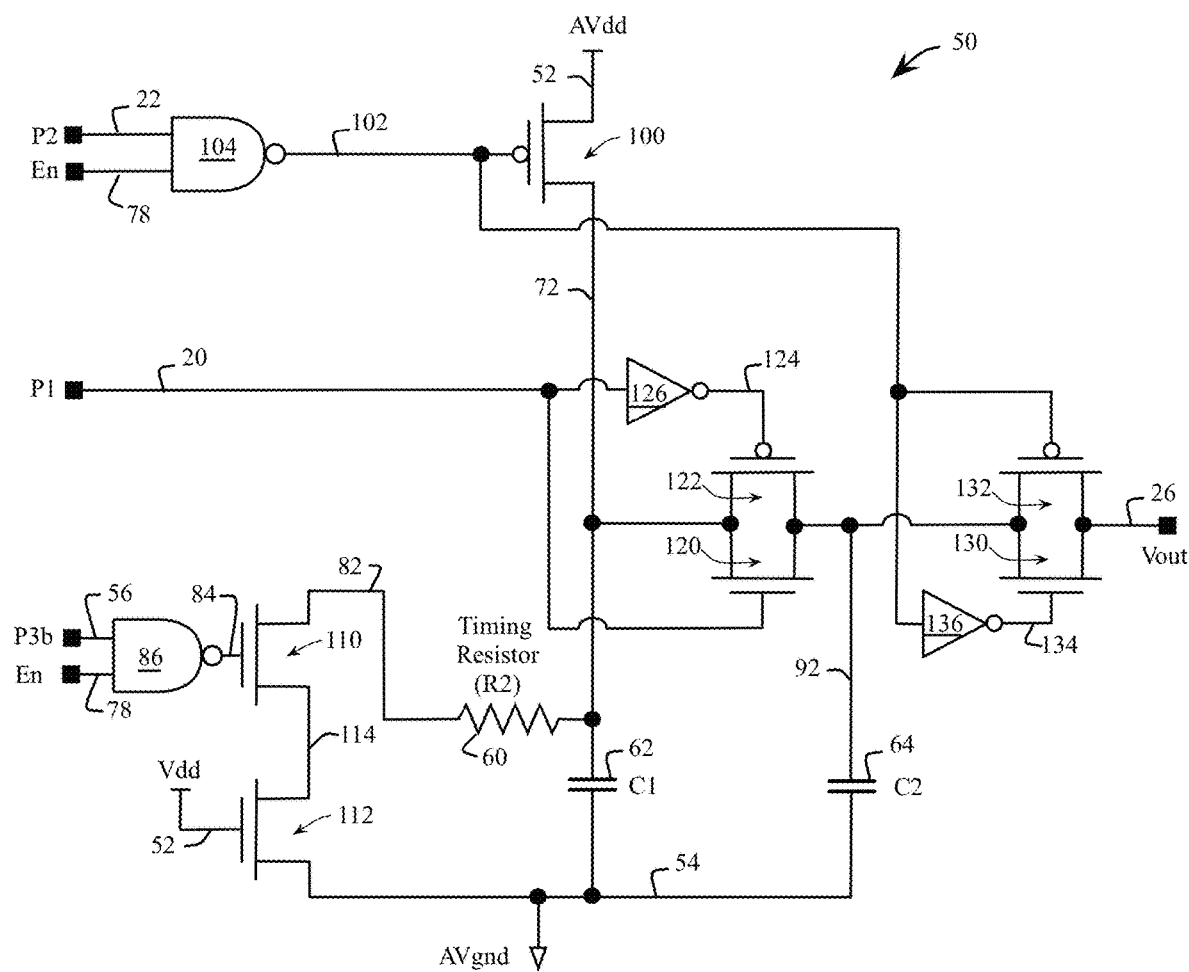
FIG. 6 is a schematic view of an example embodiment of a frequency to voltage channel.

FIG. 6 shows the example embodiment 50 of FIG. 3, FIG. 4 and FIG. 5 with additional device level detail. In FIG. 6, the switch 70 is implemented with a p-channel field effect device (PFET) 100. The PFET 100 is activated with a signal on a net 102 from a NAND gate 104. The switch 80 is implemented with an n-channel field effect device (NFET) 110, cascoded with an NFET 112 connected to net 114. In one embodiment, the dimensions of the NFET 112 are chosen to provide temperature compensation of the timing resistor 60. The switch 90 is implemented with a transmission gate formed with an NFET 120 and a PFET 122. The P1 20 activates the NFET 120, and an inverted P1 20 signal is formed at net 124 with an inverter 126 to activate the PFET 122.

Similarly, the switch 94 is implemented with a transmission gate formed with an NFET 130 and a PFET 132. The signal on net 102 activates the PFET 132, and an inverted signal from net 102 is formed at net 134 with an inverter 136 to activate the NFET 130. In the embodiment 50 shown in FIG. 3, FIG. 4, FIG. 5 and FIG. 6, the capacitance value of the timing capacitor 62 is preferably larger than the capacitance value of the holding capacitor 64. In one embodiment, the time constant formed by the timing resistor 60 and the timing capacitor 62 is chosen to utilize full voltage operating range of the embodiment 50 with an average voltage close to 50% of AVdd 52.

Figure 7:
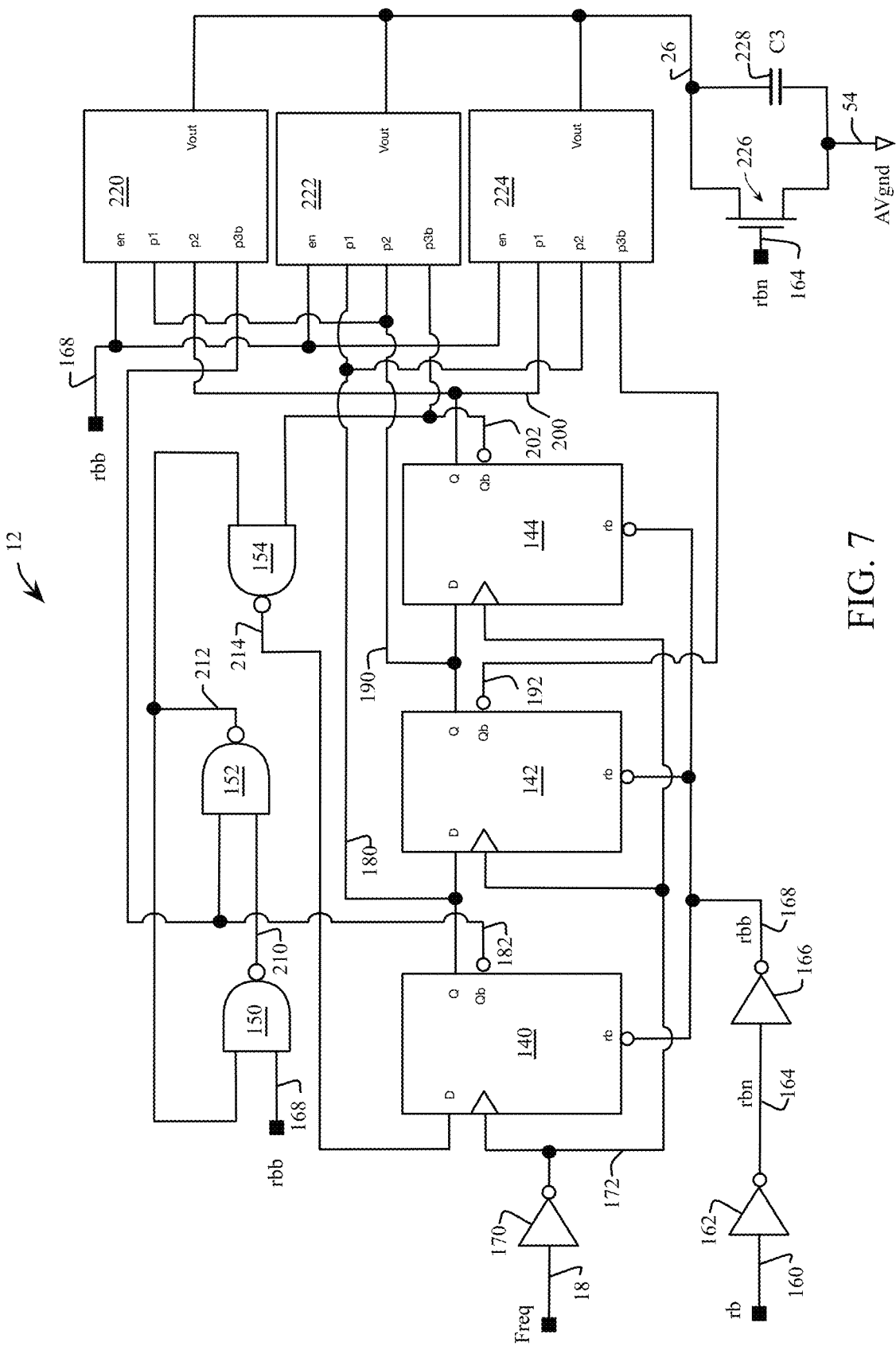
FIG. 7 is a schematic view of an example embodiment of the frequency to voltage sequencer of FIG. 1.

FIG. 7 is an example embodiment 12 of the frequency to voltage sequencer with continuous output as shown in FIG. 1. The embodiment 12 includes a three-stage shift register formed by three D-type Flip-Flops (DFF) 140, 142 and 144. In another embodiment, a similar bistable device is used in place of the DFFs 140, 142 and 144. In another embodiment, the three clock phases are generated with a decoded two stage divider, having only two Flip-Flops. Using a shift register to generate the clock phases P1 20, P2 22 and P3 24 avoids timing errors generated by resetting a three-phase circuit based on two DFFs wherein a DFF output is used to reset at least one of the DFFs. The three DFFs 140, 142 and 144 are controlled by three NAND gates 150, 152 and 154 to generate the three non-overlapping clock phases P1 20, P2 22 and P3 24. The embodiment 12 includes an inverted reset signal (rb) 160. The rb signal is inverted by an inverter 162 to form an rbn signal 164, which is subsequentially inverted by inverter 166 to form an rbb signal 168. The rb signal 160 resets each of the DFFs 140, 142 and 144. The oscillating input 18 (see FIG. 1) is inverted with an inverter 170 to provide a clock net 172, which synchronously clocks each of the DFFs 140, 142 and 144.

In response to the clock 172, the DFF 140 generates an output (Q) 180 and an inverted output (Qb) 182. In response to the clock 172, the DFF 142 generates an output (Q) 190 and an inverted output (Qb) 192. In response to the clock 172, the DFF 144 generates an output (Q) 200 and an inverted output (Qb) 202. The three NAND gates 150, 152, 154 each output a signal on nets 210, 212 and 214 respectively. The NAND gate 150 generates a signal on net 210 from inputs rbb 168 and the NAND output 212. The NAND gate 152 generates a signal on net 212 from the NAND output 210 and the Qb output 182 of DFF 140. The NAND gate 154 generates a signal on net 214 from the Qb output 202 of DFF 144 and the NAND output 212. The D input of DFF 140 is connected to the NAND output 214. The D input of DFF 142 is connected to the Q output 180 of DFF 140. The D input of DFF 144 is connected to the Q output 190 of DFF 142.

The example embodiment 12 of the frequency to voltage sequencer with continuous output further comprises three frequency to voltage channels 220, 222 and 224, each of which are described with respect to FIG. 3 through FIG. 6. Each of the frequency to voltage channels 220, 222 and 224 are enabled with rbb 168, and enabled when rb 160 or rbb 168 are high following a reset of the DFFs 140, 142 and 144. The voltage output 26 of each of the frequency to voltage channels 220, 222 and 224 are combined. The voltage output 26 is discharged to AVgnd 54 with an NFET 226 during reset of the DFFs 140, 142 and 144. Specifically, the gate of the NFET 226 is controlled by rbn 164. Following reset, the output voltage 26 from each of the three frequency to voltage channels 220, 222 and 224 are filtered and held across an output capacitor 228.

The P1 20, P2 22 and P3*b* 56 clocks inputs to the frequency to voltage channel 220 are connected to the Q output 190, Q output 200 and Qb output 182 respectively. The P1 20, P2 22 and P3*b* 56 clocks inputs to the frequency to voltage channel 222 are connected to the Q output 180, Q output 190 and Qb output 202 respectively. The P1 20, P2 22 and P3*b* 56 clocks inputs to the frequency to voltage channel 224 are connected to the Q output 200, Q output 180 and Qb output 192 respectively.

Figure 8:
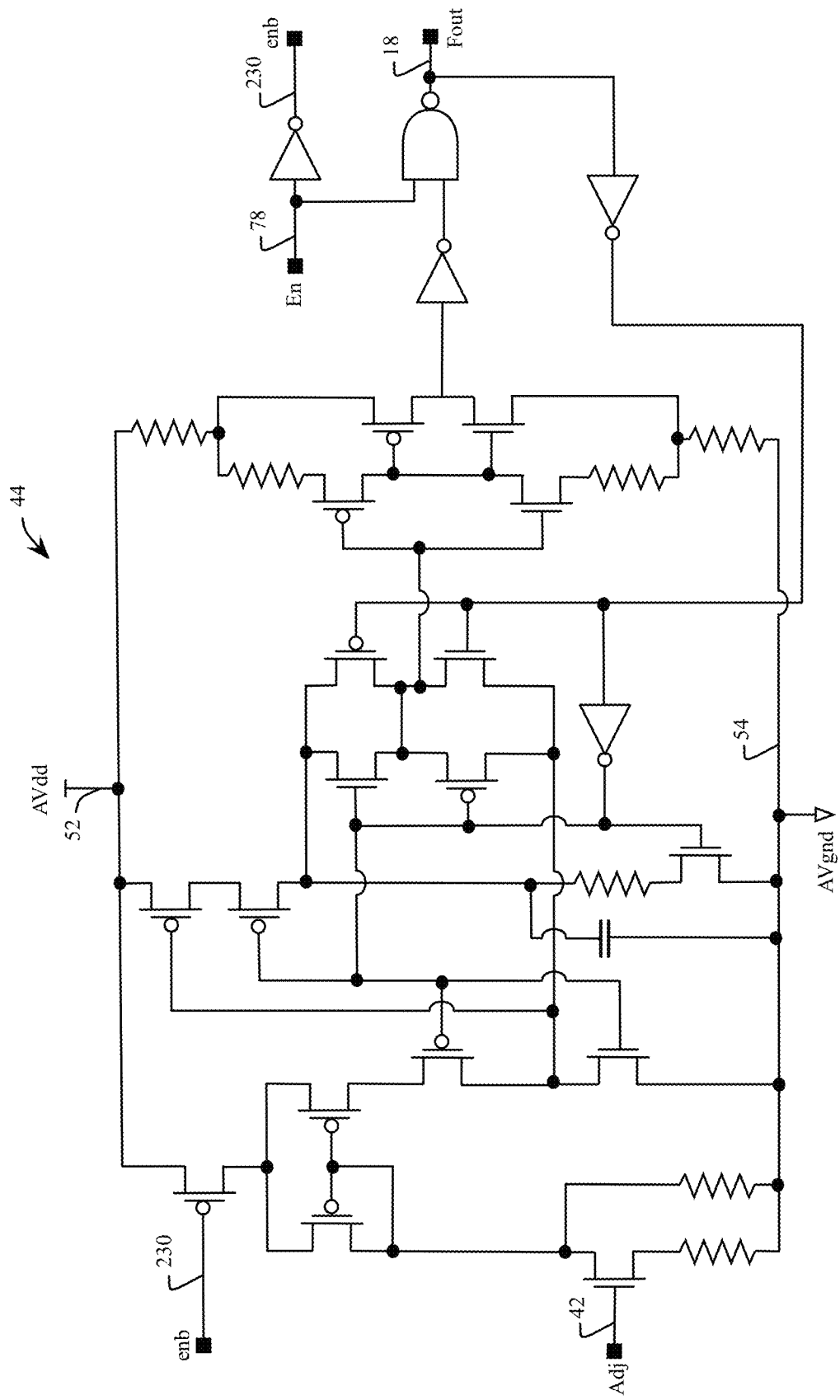
FIG. 8 is a schematic view of an example embodiment of the VCO of FIG. 1.
Figure 9:
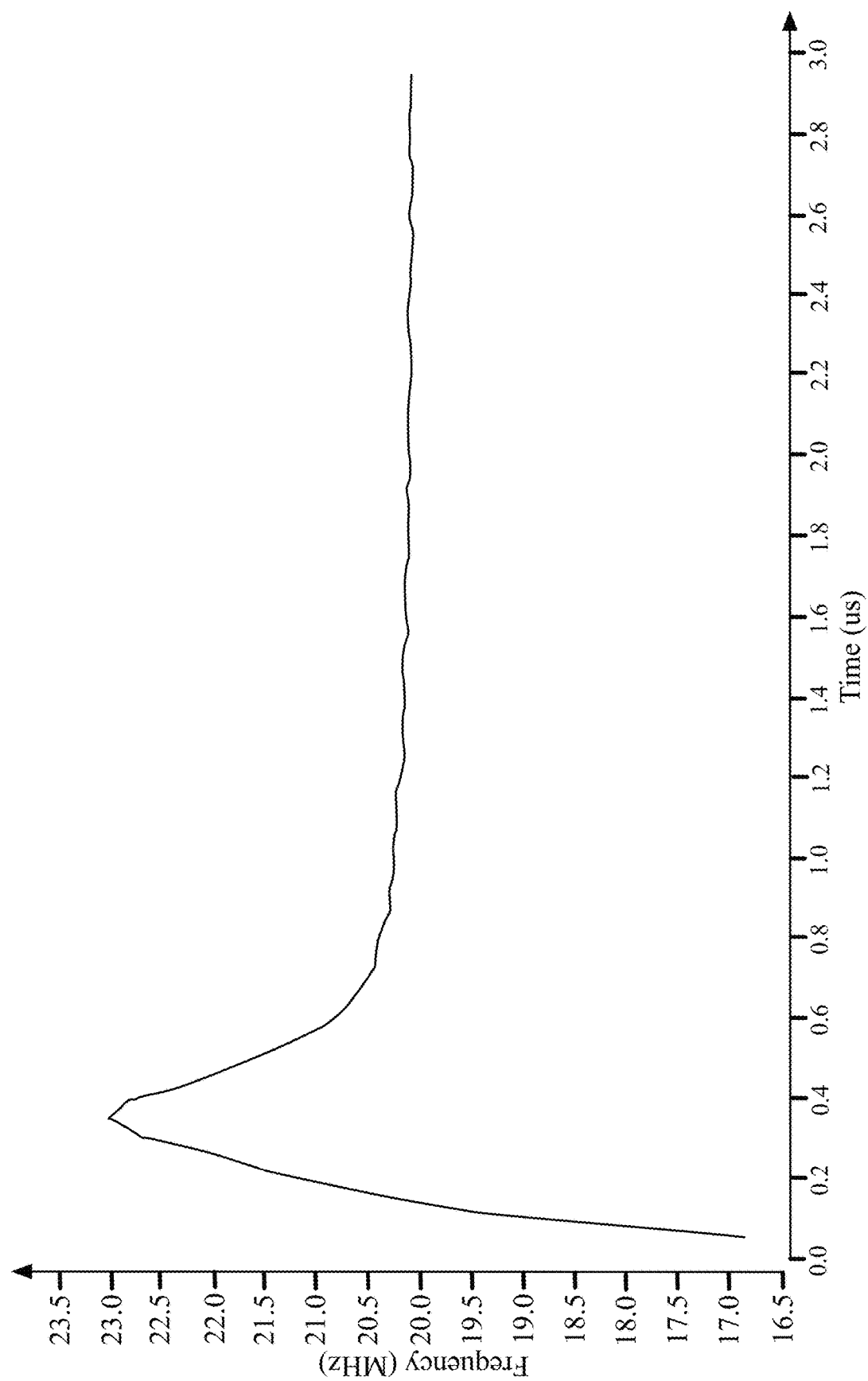
FIG. 9 is a graphical view of the settling time of the frequency output of FIG. 1, in accordance with an example embodiment of the present disclosure.

FIG. 8 shows an example embodiment 44 of the VCO of FIG. 1. The embodiment 44 of the VCO is able to startup in no more than one cycle of the oscillating input 18. With reference to FIG. 7 and FIG. 8, following the reset of DFFs 140, 142 and 144 performed by asserting rbb 168 (and thus also En 78) to a low state, rbb 168 is held high to enable the frequency to voltage channels 220, 222 and 224 and the embodiment 44 of the VCO. Specifically, the En 78 signal is inverter to generate enb 230, which enables a current mirror front-end of the VCO. It should be appreciated, that other embodiments of the VCO are envisioned to be used within this disclosure, when the other embodiments of the VCO have rapid startup characteristics. FIG. 9, with reference to FIG. 1, shows the rapid settling time of the output of the VCO 44 (e.g., the oscillating input 18) as function of frequency.

Figure 10:
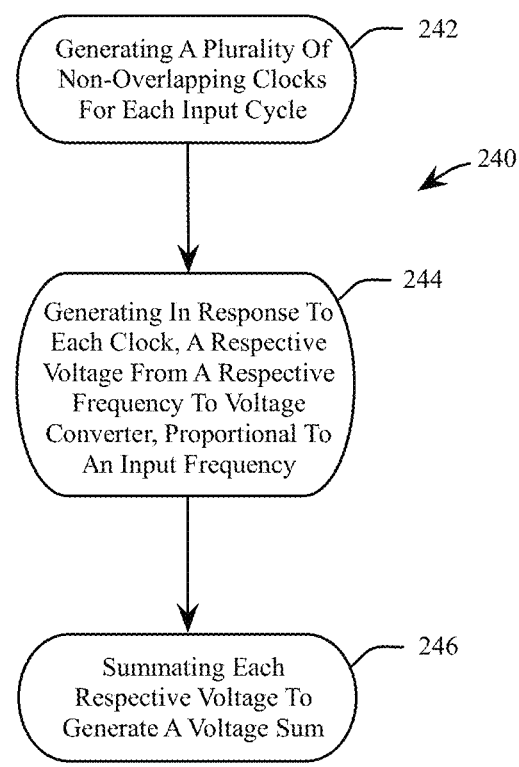
FIG. 10 is a flowchart representation of a method for multiphase frequency to voltage conversion, in accordance with an example embodiment of the present disclosure.

FIG. 10 shows an example embodiment 240 of a method for multiphase frequency to voltage conversion. With reference to FIG. 10 and to FIG. 1 and FIG. 7, at 242, a plurality of non-overlapping clocks (P1 20, P2 22 and P3 24) are generated for each input cycle of the oscillating input 18. At 244, a respective voltage (Vout 26) is generated in response to each clock (P1 20, P2 22 and P3 24) by a respective frequency to voltage converter 220, 222 and 224), proportional to an input frequency of the oscillating input 18. At 246, each respective voltage 26 is summating (see FIG. 7, where each Vout 26 is wired to a common node) to generate a voltage sum (e.g., the filtered Vout 26 across the output capacitor 228).

Figure 11:
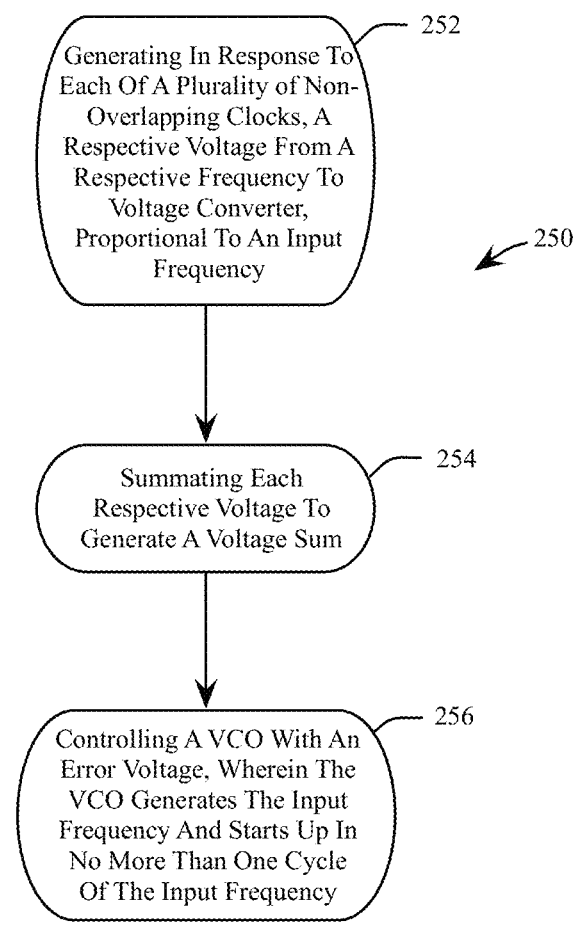
FIG. 11 is a flowchart representation of a method for multiphase frequency to voltage conversion for a fast settling VCO system, in accordance with an example embodiment of the present disclosure.

FIG. 11 shows an example embodiment 250 of a method for multiphase frequency to voltage conversion for a fast settling VCO system. With reference to FIG. 10 and to FIG. 1 and FIG. 7, at 252, a respective voltage (Vout 26) is generated in response to each generated clock (P1 20, P2 22 and P3 24) by a respective frequency to voltage converter 220, 222 and 224), proportional to an input frequency of the oscillating input 18. At 254, each respective voltage 26 is summating (see FIG. 7, where each Vout 26 is wired to a common node) to generate a voltage sum (e.g., the filtered Vout 26 across the output capacitor 228). At 256, a VCO 44 is controlled with an error voltage 34 (or 42), wherein the VCO 44 generates the input frequency of the oscillating input 18. The VCO 44 starts up in no more than one cycle of the input frequency (see FIG. 8 for an example embodiment of the VCO 44.

As will be appreciated, embodiments as disclosed include at least the following. In one embodiment, a method for multiphase frequency to voltage conversion comprises generating for each cycle of an oscillating input, one of a plurality of non-overlapping clocks. A response to each of the non-overlapping clocks is generated, with a respective one of a plurality of frequency to voltage converters, a respective voltage in proportion to an input frequency of the oscillating input. Each of the respective voltages is summated to generate a voltage sum proportional to the input frequency.

Alternative embodiments of the method for multiphase frequency to voltage conversion include one of the following features, or any combination thereof. Generating the respective voltage of each frequency to voltage converter comprises: transferring a charge from a timing capacitor to a hold capacitor with a first one of the non-overlapping clocks representing a transfer phase, charging the timing capacitor with a second one of the non-overlapping clocks representing a charge phase, and discharging the timing capacitor with a third one of the non-overlapping clocks representing a discharge phase. The plurality of non-overlapping clocks comprises three non-overlapping clocks. Each of the non-overlapping clocks are generated by a three-stage shift register. The oscillating input is generated by a Voltage Controlled Oscillator (VCO), the VCO configured to startup in no more than one cycle of the oscillating input. The VCO is controlled by an error voltage determined from a difference between the voltage sum and a trimmable voltage reference. An output frequency generated by the VCO is higher than the input frequency. An output frequency generated by the VCO is lower than the input frequency.

In another embodiment, an apparatus comprises a plurality of non-overlapping clocks, generated for each cycle of an oscillating input. A plurality of frequency to voltage converters are configured to generate, in response to each of the non-overlapping clocks, a respective voltage in proportion to an input frequency of the oscillating input. A summation circuit is configured to summate each of the respective voltages to generate a voltage sum proportional to the input frequency.

Alternative embodiments of the apparatus include one of the following features, or any combination thereof. A first one of the non-overlapping clocks is electrically coupled to a first circuit configured to transfer a charge from a timing capacitor to a hold capacitor during a transfer phase. A second one of the non-overlapping clocks is electrically coupled to a second circuit configured to charge the timing capacitor during a charge phase. A third one of the non-overlapping clocks is electrically coupled to a third circuit configured to discharge the timing capacitor during a discharge phase. The plurality of non-overlapping clocks comprises three non-overlapping clocks. Each of the non-overlapping clocks are generated by a three-stage shift register. A Voltage Controlled Oscillator (VCO) is configured to generate the oscillating input, wherein the VCO is configured to startup in no more than one cycle of the oscillating input. An error amplifier is configured to control the VCO with an error voltage determined from a difference between the voltage sum and a trimmable voltage reference. An output frequency generated by the VCO is higher than the input frequency. An output frequency generated by the VCO is lower than the input frequency.

In another embodiment, a method for multiphase frequency to voltage conversion for a fast settling Voltage Controlled Oscillator (VCO) system comprises generating in response to each of a plurality of non-overlapping clocks, with a respective one of a plurality of frequency to voltage converters, a respective voltage in proportion to an input frequency of the oscillating input. Summating each of the respective voltages to generate a voltage sum proportional to the input frequency. Controlling a VCO with an error voltage is determined from a difference between the voltage sum and a voltage reference, wherein the VCO generates the oscillating input and is configured to startup in no more than one cycle of the oscillating input.

Alternative embodiments of the method for multiphase frequency to voltage conversion for a fast settling Voltage Controlled Oscillator (VCO) system include one of the following features, or any combination thereof. Generating the respective voltage of each frequency to voltage converter comprises: transferring a charge from a timing capacitor to a hold capacitor with a first one of the non-overlapping clocks, charging the timing capacitor with a second one of the non-overlapping clocks, and discharging the timing capacitor with a third one of the non-overlapping clocks. Each of the non-overlapping clocks are generated by a shift register. The plurality of non-overlapping clocks comprises at least three non-overlapping clocks.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A method for multiphase frequency to voltage conversion comprising:
  generating for each cycle of an oscillating input, one of a plurality of non-overlapping clocks;
  generating in response to each of the non-overlapping clocks, with a respective one of a plurality of frequency to voltage converters, a respective voltage in proportion to an input frequency of the oscillating input; and summating each of the respective voltages to generate a voltage sum proportional to the input frequency;

wherein the plurality of non-overlapping clocks includes three non-overlapping clocks.

2. The method of claim 1 wherein generating the respective voltage of each frequency to voltage converter comprises:

transferring a charge from a timing capacitor to a hold capacitor with a first one of the non-overlapping clocks representing a transfer phase, charging the timing capacitor with a second one of the non-overlapping clocks representing a charge phase, and discharging the timing capacitor with a third one of the non-overlapping clocks representing a discharge phase.

3. The method of claim 1:

wherein each of the non-overlapping clocks are generated by a three-stage shift register.

4. The method of claim 1 wherein the oscillating input is generated by a Voltage Controlled Oscillator (VCO), the VCO configured to startup in no more than one cycle of the oscillating input.

5. The method of claim 4 wherein the VCO is controlled by an error voltage determined from a difference between the voltage sum and a trimmable voltage reference.

6. The method of claim 4 further comprising a divide by sequencer coupled between the VCO and the frequency to voltage converters;

wherein an output frequency generated by the VCO is higher than the input frequency at the frequency to voltage converters.

7. An apparatus comprising:

a plurality of non-overlapping clocks, generated for each cycle of an oscillating input;

a plurality of frequency to voltage converters configured to generate, in response to each of the non-overlapping clocks, a respective voltage in proportion to an input frequency of the oscillating input; and a summation circuit configured to summate each of the respective voltages to generate a voltage sum proportional to the input frequency;

wherein the plurality of non-overlapping clocks comprises three non-overlapping clocks.

8. The apparatus of claim 7 wherein:

a first one of the non-overlapping clocks is electrically coupled to a first circuit configured to transfer a charge from a timing capacitor to a hold capacitor during a transfer phase, a second one of the non-overlapping clocks is electrically coupled to a second circuit configured to charge the timing capacitor during a charge phase, and a third one of the non-overlapping clocks is electrically coupled to a third circuit configured to discharge the timing capacitor during a discharge phase.

9. The apparatus of claim 7:

wherein each of the non-overlapping clocks are generated by a three-stage shift register.

10. The apparatus of claim 7 further comprising a Voltage Controlled Oscillator (VCO) configured to generate the oscillating input, wherein the VCO is configured to startup in no more than one cycle of the oscillating input.

11. The apparatus of claim 10 further comprising an error amplifier configured to control the VCO with an error voltage determined from a difference between the voltage sum and a trimmable voltage reference.

12. The apparatus of claim 10 further comprising a divide by sequencer coupled between the VCO and the frequency to voltage converters;

wherein an output frequency generated by the VCO is higher than the input frequency at the frequency to voltage converters.

13. A method for multiphase frequency to voltage conversion for a Voltage Controlled Oscillator (VCO) system comprising:

generating in response to each of a plurality of non-overlapping clocks, with a respective one of a plurality of frequency to voltage converters, a respective voltage in proportion to an input frequency of the oscillating input;

summating each of the respective voltages to generate a voltage sum proportional to the input frequency; and controlling a VCO with an error voltage determined from a difference between the voltage sum and a voltage reference, wherein the VCO generates the oscillating input and is configured to startup in no more than one cycle of the oscillating input and wherein each of the non-overlapping clocks are generated by a shift register.

14. The method of claim 13 wherein generating the respective voltage of each frequency to voltage converter comprises:

transferring a charge from a timing capacitor to a hold capacitor with a first one of the non-overlapping clocks, charging the timing capacitor with a second one of the non-overlapping clocks, and discharging the timing capacitor with a third one of the non-overlapping clocks.

15. The method of claim 13 wherein the plurality of non-overlapping clocks comprises at least three non-overlapping clocks.

* * * * *